United States Patent
Qu et al.

(10) Patent No.: US 9,263,597 B2
(45) Date of Patent: *Feb. 16, 2016

(54) SEMICONDUCTOR ARRANGEMENT HAVING A SCHOTTKY DIODE

(75) Inventors: Ning Qu, Reutlingen (DE); Alfred Goerlach, Kusterdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 142 days.

This patent is subject to a terminal disclaimer.

(21) Appl. No.: 13/882,412

(22) PCT Filed: Sep. 9, 2011

(86) PCT No.: PCT/EP2011/065614
§ 371 (c)(1),
(2), (4) Date: Sep. 17, 2013

(87) PCT Pub. No.: WO2012/055627
PCT Pub. Date: May 3, 2012

(65) Prior Publication Data
US 2014/0001593 A1   Jan. 2, 2014

(30) Foreign Application Priority Data
Oct. 29, 2010   (DE) .......................... 10 2010 043 088

(51) Int. Cl.
*H01L 29/872* (2006.01)
*H01L 29/40* (2006.01)
*H01L 29/417* (2006.01)

(52) U.S. Cl.
CPC ............ *H01L 29/872* (2013.01); *H01L 29/404* (2013.01); *H01L 29/417* (2013.01)

(58) Field of Classification Search
CPC ... H01L 29/404; H01L 29/417; H01L 29/872; H01L 29/0619; H01L 29/47; H01L 29/66143; H01L 29/7806; H01L 51/0579; H01L 2924/12032
USPC ........... 257/109, 476, 478, 594, 621, 622, 73, 257/155, 284, 471
See application file for complete search history.

(56) References Cited

U.S. PATENT DOCUMENTS 5,262,668 A * 11/1993 Tu et al. ........................ 257/475
6,917,054 B2 * 7/2005 Onose et al. .................... 257/77
(Continued)

FOREIGN PATENT DOCUMENTS

DE   10 2004 059640   6/2006
DE   10 2007 002965   7/2008
(Continued)

OTHER PUBLICATIONS

Seung-Chul Lee et al. : "A new vertical GaN schottky barrier diode with floating metal ring for high breakdown voltage", Power Semiconductor Devices and ICS, 2004. Proceedings. ISPSD '04. The 16th International Symposium on Kitakyushu Int. Conf. Ctr, Japan May 24-27, 2004, Piscataway, NJ, USA, IEEE, May 24, 2004, pp. 319-322, XP010723403, ISBN : 978-4-88686-060-6.

*Primary Examiner* — Jesse Y Miyoshi
*Assistant Examiner* — David Spalla
(74) *Attorney, Agent, or Firm* — Kenyon & Kenyon LLP

(57) ABSTRACT

A semiconductor assemblage of a super-trench Schottky barrier diode (STSBD) made up of an $n^+$ substrate, an n-epilayer, trenches etched into the n-epilayer that have a width and a distance from the $n^+$ substrate, mesa regions between the adjacent trenches having a width, a metal layer on the front side of the chip that is a Schottky contact and serves as an anode electrode, and a metal layer on the back side of the chip that is an ohmic contact and serves as a cathode electrode, wherein multiple Schottky contacts having a width or distance and a distance between the Schottky contacts, and between the Schottky contact as anode electrode and the first Schottky contact, are located on the trench wall.

19 Claims, 4 Drawing Sheets

(56) References Cited

U.S. PATENT DOCUMENTS

| | | | | |
|---|---|---|---|---|
| 7,061,066 B2 * | 6/2006 | Kocon | ........................... | 257/476 |
| 7,902,626 B2 * | 3/2011 | Goerlach et al. | ............... | 257/476 |
| 8,759,888 B2 * | 6/2014 | Qu et al. | ........................ | 257/284 |
| 2004/0256690 A1 * | 12/2004 | Kocon | ........................... | 257/471 |
| 2009/0212331 A1 | 8/2009 | Werner | | |

FOREIGN PATENT DOCUMENTS

| | | |
|---|---|---|
| JP | 08-116072 | 5/1996 |
| JP | 2000-052479 | 8/1999 |
| JP | 2003-142698 | 5/2003 |
| JP | 2003-298072 | 10/2003 |
| JP | 2004-327824 | 11/2004 |
| JP | 2005-285913 | 10/2005 |
| JP | 2007-529115 | 10/2007 |
| JP | 2008-235590 | 10/2008 |
| JP | 2009-088019 | 4/2009 |
| JP | 2010-192555 | 9/2010 |

* cited by examiner

SEMICONDUCTOR ARRANGEMENT HAVING A SCHOTTKY DIODE

FIELD OF THE INVENTION

The present invention relates to Schottky diodes that are suitable for high-voltage utilization and at the same time exhibit a low forward voltage and low switching power dissipation.

BACKGROUND INFORMATION

High-voltage PN diodes may generally be used for high-voltage applications. Advantages of high-voltage PN diodes are low reverse current and great robustness. The disadvantages are on the one hand the high forward voltage UF and on the other hand the high switching power dissipation.

In a high-voltage PN diode, voltage is accepted principally by the low-doped region, i.e. the space charge zone extends principally in the low-doped region. The doping concentration and thickness of this low-doped region are determined by the predefined breakdown voltage. A high breakdown voltage means a low doping concentration and a large thickness for this low-doped region.

When operating at high current density in the forward direction, high injection exists in high-voltage PN diodes, i.e. electrons and holes are injected into the low-doped region. With high injection, the concentration thereof is higher than the doping concentration of the low-doped region. The result is that the conductivity of the low-doped region is modulated, i.e. the conductivity becomes elevated. This reduces the forward voltage in advantageous fashion. The current of a high-voltage PH diode begins to flow at room temperature, however, only starting at approximately a forward voltage UF=0.7 V. Under normal operating conditions, e.g. at a current density>100 A/cm$^2$, UF rises to values above 1 V. A correspondingly high, undesirable power dissipation is associated with this. Because a high-voltage PN diode requires a thick low-doped region, the voltage drop in the forward direction across the low-doped region is therefore relatively large despite conductivity modulation.

Upon shutdown, for example in the context of an abrupt current commutation, the charge carriers (electrons and holes) that are injected during operation in the forward direction into the low-doped region and stored there must first be dissipated before the high-voltage PN diode is at all capable of accepting reverse voltage again. In the event of an abrupt current commutation the current therefore at first continues to flow in the reverse direction until the stored charge carriers have been dissipated or cleared out. This current is also referred to as "reverse recovery current." This operation, i.e. the magnitude and duration of the reverse recovery current, is determined chiefly by the volume of charge carriers stored in the low-doped region. The more charge carriers that are present, the higher the reverse recovery current. A high reverse recovery current also means a higher shutdown power dissipation. Integrating the shutdown current over time yields the reverse recovery charge Qrr, which is an important variable for describing the shutdown power dissipation and should be as low as possible.

In the design of high-voltage PN diodes, compromises must always be made between breakdown voltage, forward voltage, and shutdown power dissipation.

The shutdown power dissipation in high-voltage Schottky diodes is considerably lower as compared with high-voltage PN diodes.

The high-voltage Schottky diode is a so-called majority charge carrier component in which, even when there is a high current density during operation in the forward direction, no high injection occurs, i.e. no injection of electrons and holes into the low-doped region takes place during operation in the forward direction.

Because no high injection with conductivity modulation occurs with a high-voltage Schottky diode, however, a high voltage drops across the low-doped region when operated with high currents. This has hitherto limited the use of high-reverse Schottky diodes to very small currents. High-voltage Schottky diodes using silicon technology for high currents are therefore not known.

SUMMARY OF THE INVENTION

A high-voltage Schottky diode using trench technology (STSBD=super-trench Schottky barrier diode) having a low forward voltage is proposed, which can be operated at high current densities and exhibits low shutdown power dissipation. The previously applicable limitation to low forward currents is thereby eliminated.

The super-trench Schottky barrier diode (STSBD) of this invention represents a trench structure having multiple floated Schottky contacts on the trench wall. The result is that a periodically homogeneous field distribution, and an almost linear voltage distribution, form in the mesa region. The doping concentration selected for a predefined breakdown voltage can be higher by a factor of 5 to 10 than with a conventional high-voltage PN diode or high-voltage Schottky diode. As a result, a very advantageous design compromise between breakdown voltage, forward voltage, and shutdown power dissipation is achieved.

As compared with high-voltage PN diodes: lower or comparable forward voltage at high current density, but considerably lower shutdown power dissipation.

As compared with high-voltage Schottky diodes: considerably lower forward voltage at high current density.

DETAILED DESCRIPTION

Figure 1:
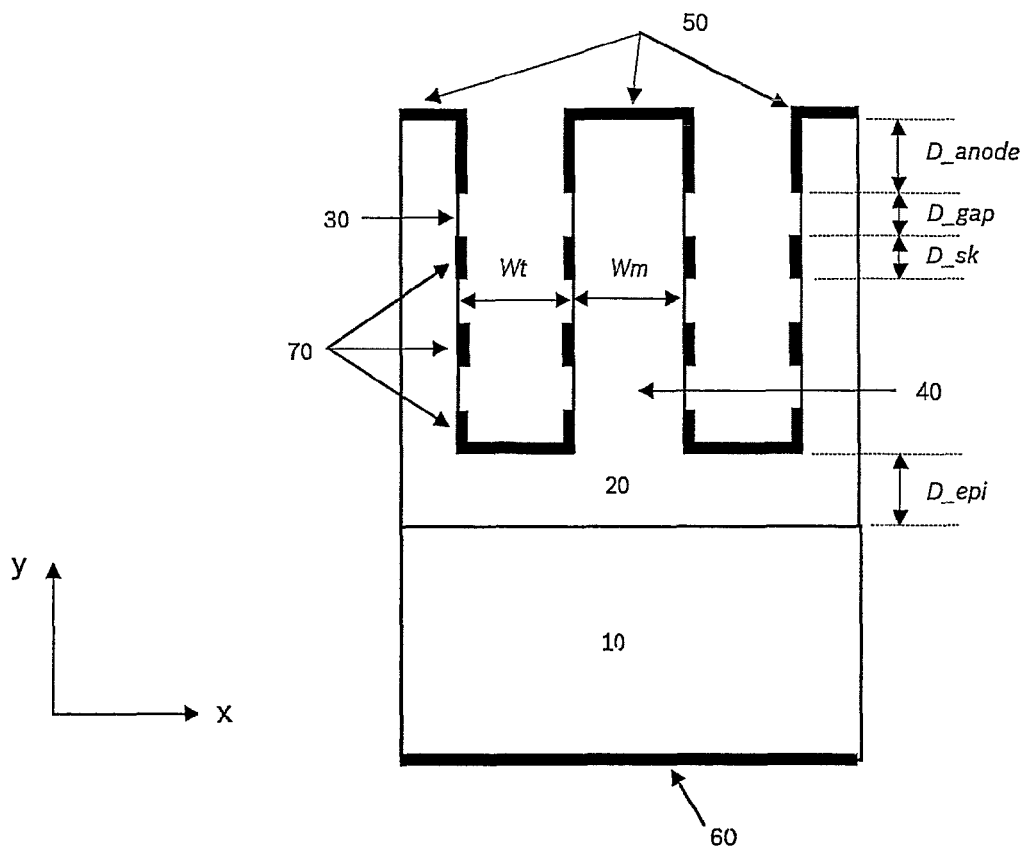
FIG. 1 shows the structure of the super-trench Schottky barrier diode (STSBD) as an exemplifying embodiment of the invention.

Detailed description of the configuration and function of the invention, with possible alternatives:

An exemplifying embodiment according to the present invention of a super-trench Schottky barrier diode (STSBD) is depicted in cross section in FIG. 1. The STSBD is made up of an $n^+$ substrate 10, an n-epilayer 20, trenches 30 etched into n-epilayer 20 that have a width Wt and a distance D_epi from $n^+$ substrate 10, mesa regions 40 between the adjacent trenches 30 having a width Wm, a metal layer 50 acting as a Schottky contact on the front side of the chip (the anode electrode), a metal layer 60 on the back side of the chip (the cathode electrode), and further Schottky contacts 70 on the trench wall, having a width or distance D_sk and a distance D_gap between the Schottky contacts. Metal layer 50 covers the trench wall up to a depth D_anode and at a distance D_gap from the first Schottky contact 70. Schottky contacts 70 float on the trench wall. The last floated Schottky contact covers the trench floor.

In the STSBD of this invention, currents flow in the forward direction from Schottky contact 50 as anode electrode through mesa region 40, the epi region between the trench floor and $n^+$ substrate 10, to metal layer 60 on the back side of the chip as cathode electrode. Currents are conveyed via the floated Schottky contacts 70 only because they represent low-impedance current paths.

The back-side contact represents an ohmic contact. Al other metal semiconductor contacts are Schottky contacts.

In the reverse direction, a space charge zone forms in n-epilayer 20 located beneath Schottky contact 50. With increasing voltage, the space charge zone expands toward the trench floor. If the space charge zone reaches the first floated Schottky contact at a voltage V1, that voltage V1 is accepted by the first floated Schottky contact. As the voltage rises further, the space charge zone expands farther toward the trench floor. The voltage at the first floated Schottky contact remains unchanged.

Analogously, at a higher voltage Vn the space charge zone reaches the n-th floated Schottky contact. The n-th floated Schottky contact accepts the voltage Vn. Once again, as the voltage rises further the voltage at the n-th floated Schottky contact remains unchanged.

Figure 2:
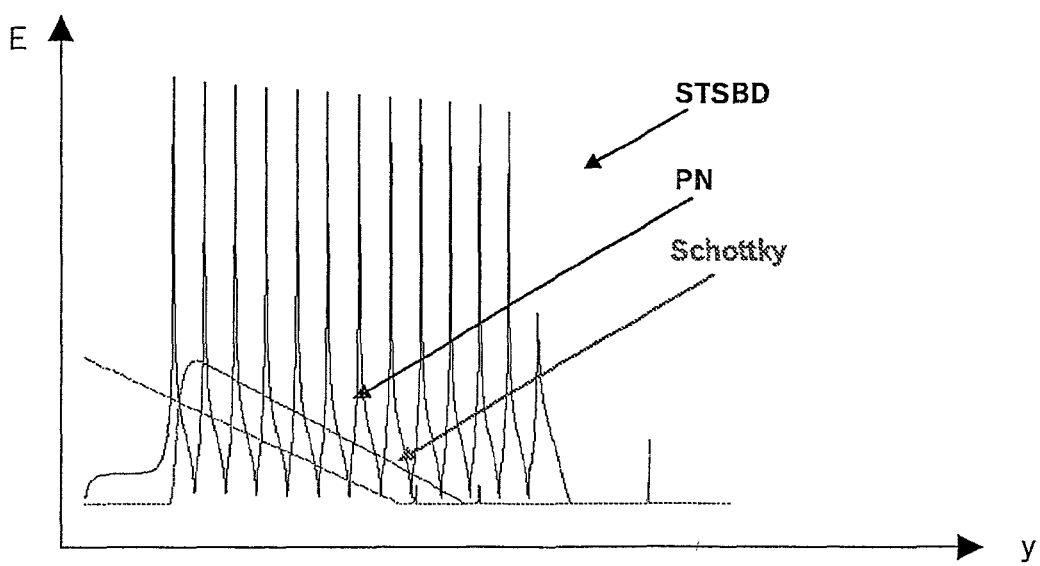
FIG. 2 shows the field distribution of the STSBD of this invention upon breakdown (simulation): cut along the trench wall. For comparison: high-voltage PN diode, high-voltage Schottky diode.
Figure 3:
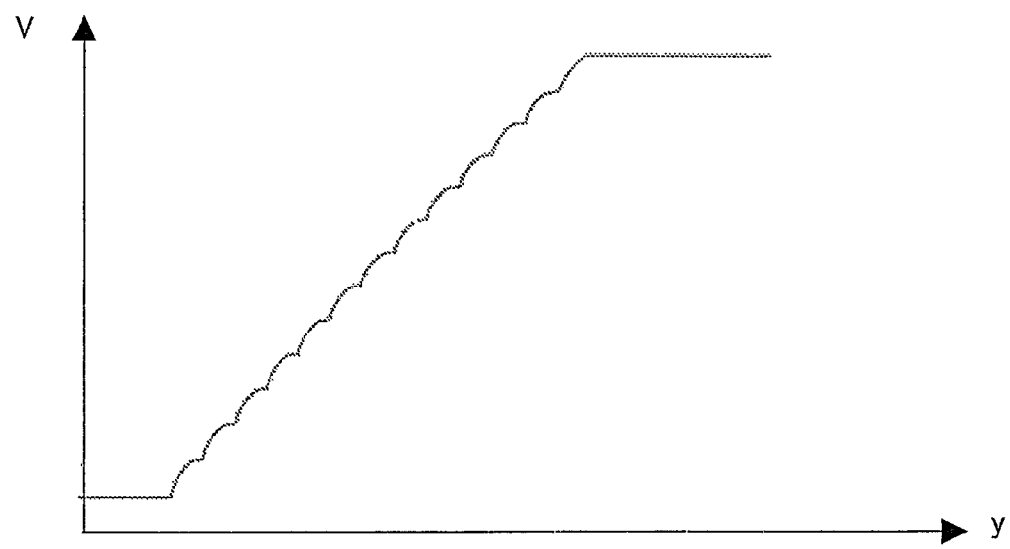
FIG. 3 shows the voltage distribution of the STSBD of this invention upon breakdown (simulation): cut along trench wall.

If the width D_sk and distance D_gap in the STSBD structure is selected to be same for all Schottky contacts 70, a periodically homogeneous field distribution exists in mesa region 40. This situation is shown in FIG. 2 as a simulation result. The field distribution in the mesa region continuously repeats at a distance D_sk+D_gap until ultimately the trench floor is reached. The voltage distribution in mesa region 40, as depicted as a simulation result in FIG. 3, is then largely linear. As compared with conventional high-voltage PN diodes or high-voltage Schottky diodes, the field distributions of which are likewise visible in FIG. 2, with the STSBD of this invention a substantially higher voltage can be accommodated for a predetermined thickness of the low-doped region.

In the reverse state, an STSBD of this invention can be construed electrically as a series circuit of multiple low-voltage diodes. In forward operation, on the other hand, in contrast to a usual series circuit of diodes, only a forward voltage drops, namely the forward voltage of the Schottky diode made up of anode metal 50 and n-epilayer 20. As compared with conventional high-voltage PN diodes or high-voltage Schottky diodes with comparable breakdown voltages, it is thus possible to select the doping concentration of the low-doped region 20 in an STSBD of this invention to be considerably higher, for example by a factor of 5 to 10. The result is that the voltage drop at the high-impedance n-region 20 is substantially smaller, and substantially higher forward currents can flow for a comparable forward voltage.

Figure 4:
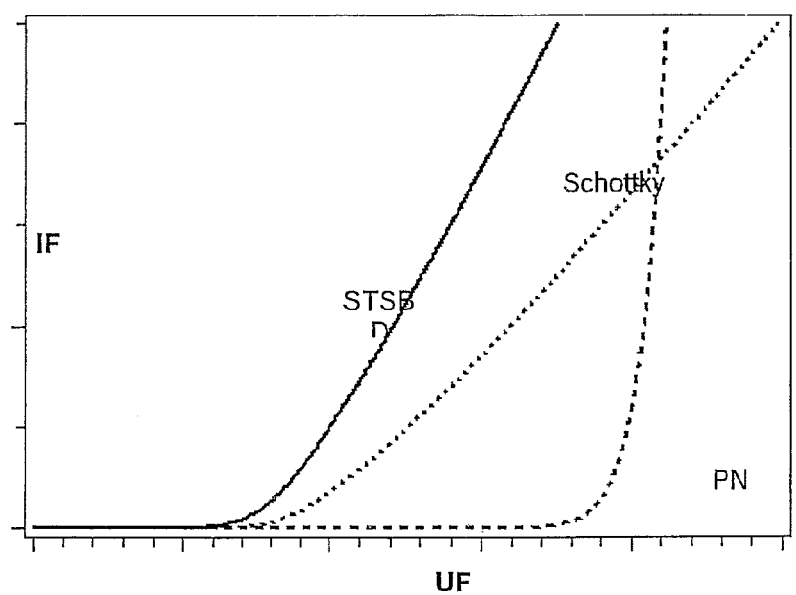
FIG. 4 shows a comparison in forward voltage VF between the STSBD of this invention and a high-voltage PN diode and high-voltage Schottky diode; current density up to 100 A/cm$^2$ (simulation).

This results in advantages in terms of forward voltage as compared with both conventional high-voltage Schottky diodes and conventional high-voltage PN diodes. This is illustrated in FIG. 4 with reference to simulation results.

a) Comparison with Conventional High-Voltage Schottky Diodes:

With the STSBD the forward voltage in the high current density region is much lower, since the doping concentration of the low-doped region is substantially higher.

b) Comparison with conventional high-voltage PN diodes: Because appropriate selection of the barrier metal allows the forward voltage selected for an STSBD (measured at low current densities) to be lower than the comparable forward voltage of a PN diode, the forward voltage remains lower even at higher currents. Up to a current density of approximately 100 A/cm$^2$, for example, the forward voltage remains below 0.7 V and thus lower than a PN forward voltage.

Figure 5:
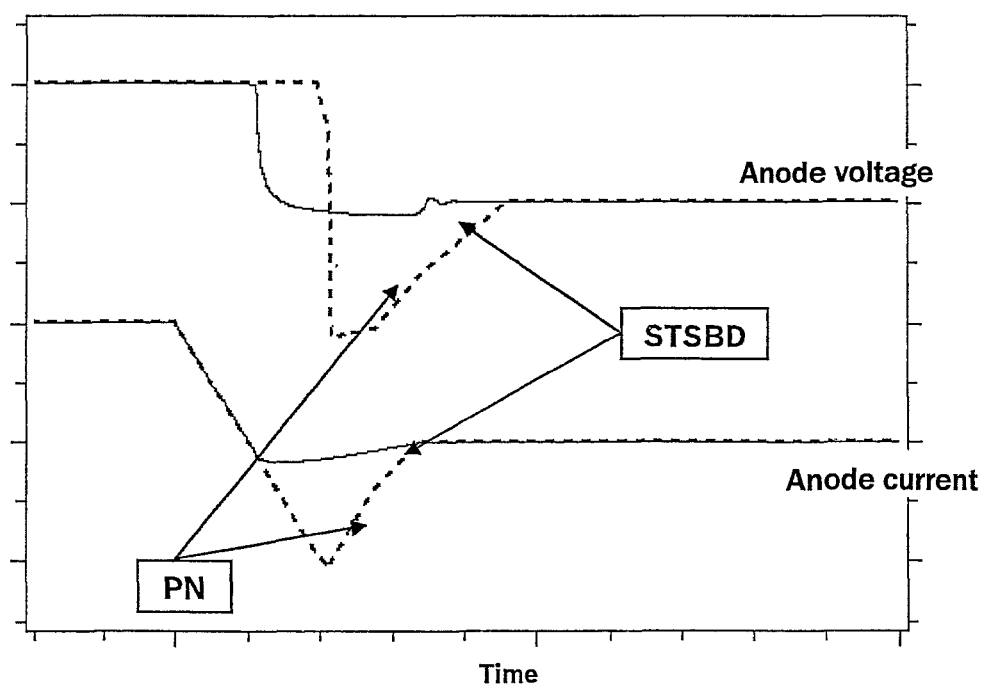
FIG. 5 shows the change over time in voltage and current upon shutdown; comparison between STSBD of this invention and high-voltage PN diode (simulation).

An essential advantage as compared with conventional high-voltage PN diodes is represented in particular by the fast, low-power switch-off behavior of the STSBD. Because the STSBD of this invention is a Schottky diode, and as a consequence thereof is a majority charge carrier component, the shutdown power dissipation is significantly less than that of a high-voltage PN diode. An example of this comparison between the STSBD of this invention and the high-voltage PN diode is depicted in FIG. 5.

Design considerations allow the following structural parameters to be optimized:

D_anode (width of Schottky contact 50 as anode electrode that covers the trench wall): tradeoff between leakage current and forward voltage;

D_sk (width of the floated Schottky contacts 70 on trench wall): influences decoupling of the individual periodic regions in the mesa;

D_gap (distance between the floated Schottky contact 70 on the trench wall): influences linearity of the voltage distribution in the mesa region;

Wt (width of trench region 30): influences forward voltage;

Wm (width of mesa region 40): tradeoff between leakage current and forward voltage;

D_epi (distance between trench floor and $n^+$ substrate 10): tradeoff between total breakdown voltage and voltage of the last Schottky contact upon breakdown.

FIGS. 2 to 5 show simulation results for a 200 V STSBD having 12 floated Schottky contacts, having the following structural parameters and doping concentrations:

Doping concentration of n-epilayer=1E16/cm$^3$
Doping concentration of $n^+$ substrate=1E19/cm$^3$
D_anode=4 µm
D_sk=0.4 µm
D_gap=1.0 µm
Wt=Wm=0.8 µm
D_epi=5 µm.

Figure 6:
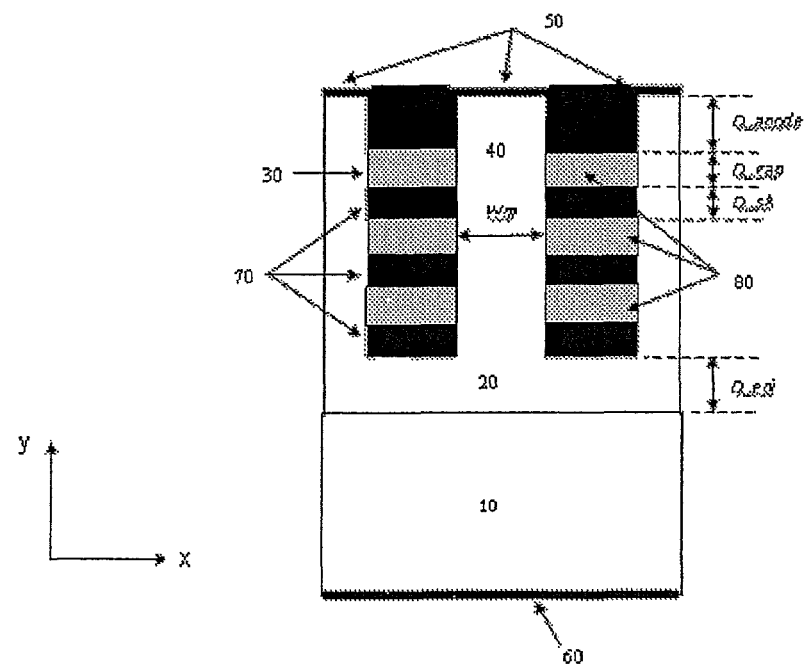
FIG. 6 shows the structure of a further embodiment of a super-trench Schottky barrier diode (STSBD) of this invention.

FIG. 6 depicts a further embodiment of an assemblage according to the present invention. In contrast to the first assemblage according to FIG. 1, the floating Schottky contacts 70 span the entire trench region 30. Respective dielectric layers 80 are located between the Schottky contacts 70, so that the individual floating Schottky contacts 70 are electrically insulated from one another and from anode contact 50. Oxide layers may be used as dielectric layers.

Figure 7:
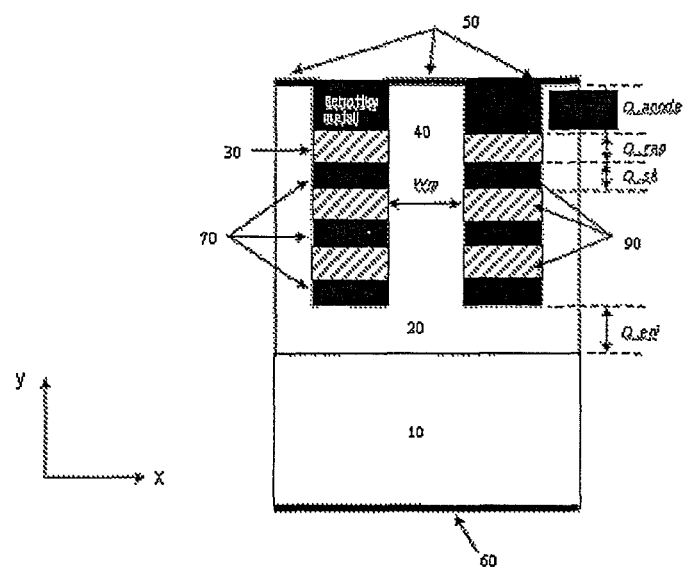
FIG. 7 shows the structure of a further embodiment of a super-trench Schottky barrier diode (STSBD) of this invention.

A third exemplifying embodiment is presented in FIG. 7. It resembles the construction of the previous example in accordance with FIG. 6. In contrast thereto, dielectric layers 80 are replaced with n-doped polysilicon or silicon 90. The doping of layers 90 may correspond to the doping of n-epilayer 20.

What is claimed is:

1. A semiconductor assemblage, comprising:
    a super-trench Schottky barrier diode (STSBD) having:
        an $n^+$ substrate,
        an n-epilayer,
        trenches, each trench having trench walls and a trench floor, etched into the n-epilayer that have a width and a distance from the $n^+$ substrate,
        mesa regions between the adjacent trenches that have a width,
        a metal layer on a front side of a chip that is a Schottky contact and serves as an anode electrode,
        a metal layer on a back side of the chip that is an ohmic contact and serves as a cathode electrode, and
        multiple Schottky contacts, on the trench walls of each trench, each of the Schottky contacts on the trench walls: (i) having a width and (ii) being spaced apart from other Schottky contacts on the trench walls by a distance, and the multiple Schottky contacts beginning at a depth down each respective trench wall corresponding to a depth of the Schottky contact that serves as the anode electrode plus a gap depth.

2. The semiconductor assemblage of claim 1, wherein each of the Schottky contacts on the trench wall has a voltage that varies from voltages of the other Schottky contacts on the trench wall by an electric potential difference.

3. The semiconductor assemblage of claim 1, wherein the metal layer on the front side of the chip covers only the trench wall up to the depth of the Schottky contact that serves as the anode electrode.

4. The semiconductor assemblage of claim 1, wherein the metal layer on the front side of the chip covers up a length of the trench floor for the depth of the Schottky contact that serves as the anode electrode.

5. The semiconductor assemblage of claim 2, wherein the last floated Schottky contact covers the trench floor and is at a distance from the $n^+$ substrate.

6. The semiconductor assemblage of claim 2, wherein the STSBD structure possesses a uniform width of the floated Schottky contacts and a uniform distance between the Schottky contacts and between the Schottky contact as anode electrode and the first Schottky contact.

7. The semiconductor assemblage of claim 1, wherein a field distribution in the mesa region periodically repeats in accordance with a distance.

8. The semiconductor assemblage of claim 1, wherein the voltage distribution in the mesa region is almost linear.

9. The semiconductor assemblage of claim 2, wherein the floating Schottky contacts each cover a length of the trench floor for a respective width of the floating Schottky contact on the trench wall, and wherein dielectric layers are present between the floating Schottky contacts.

10. The semiconductor assemblage of claim 2, wherein the floating Schottky contacts each cover a length of the trench floor for a respective width of the floating Schottky contact on the trench wall, and wherein silicon or polysilicon is present between the floating Schottky contacts.

11. The semiconductor assemblage of claim 1, wherein the doping concentration of the epilayer is higher-doped than in a conventional high-voltage PN diode or a high-voltage Schottky diode.

12. The semiconductor assemblage of claim 1, wherein the assemblage has a breakdown voltage in the range greater than 200 V.

13. The semiconductor assemblage of claim 1, wherein the trenches have a rectangular shape or a U-shape or a similar shape.

14. The semiconductor assemblage of claim 1, wherein the trenches are disposed in a stripe disposition or as islands, the islands being of circular, hexagonal or other configuration.

15. The semiconductor assemblage of claim 1, wherein the trenches are produced by etching into the n-epilayer.

16. The semiconductor assemblage of claim 1, wherein all semiconductor layers are made up of the respectively opposite conductivity type, and wherein the designations of the anode and cathode connections are transposed.

17. The semiconductor assemblage of claim 1, wherein it is configured as a component and possesses a solderable front-side metallization and back-side metallization.

18. The semiconductor assemblage of claim 17, wherein the components are configured as press-fit diodes and are installed in a press-fit diode housing.

19. The semiconductor assemblage of claim 1, wherein the press-fit diodes are used in a rectifier of a motor vehicle generator.

* * * * *